(12) United States Patent
Lee et al.

(10) Patent No.: US 9,030,802 B2
(45) Date of Patent: May 12, 2015

(54) MULTILAYER CERAMIC ELECTRONIC COMPONENT, MANUFACTURING METHOD THEREOF, AND BOARD FOR MOUNTING THE SAME

(71) Applicant: Samsung Electro-Mechanics Co., Ltd., Suwon, Gyunggi-do (KR)

(72) Inventors: Min Gon Lee, Gyunggi-do (KR); Dae Bok Oh, Gyunggi-do (KR); Jong Han Kim, Gyunggi-do (KR); Seung Ho Lee, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 19 days.

(21) Appl. No.: 13/924,434

(22) Filed: Jun. 21, 2013

(65) Prior Publication Data
US 2014/0311782 A1   Oct. 23, 2014

(30) Foreign Application Priority Data

Apr. 18, 2013   (KR) .................. 10-2013-0042860

(51) Int. Cl.
*H01G 4/06*   (2006.01)
*H01G 4/30*   (2006.01)
*H05K 1/18*   (2006.01)

(52) U.S. Cl.
CPC . *H01G 4/30* (2013.01); *H05K 1/181* (2013.01)

(58) Field of Classification Search
CPC ......... H01G 2/06; H01G 2/065; H01G 4/005; H01G 4/12; H01G 4/30; H01G 4/224; H01G 4/228; H01G 4/232; H01G 4/248

USPC ............ 361/301.1, 301.3, 301.4, 303, 306.1, 361/306.3, 321.1, 321.2, 308, 310, 312
See application file for complete search history.

(56) References Cited

U.S. PATENT DOCUMENTS

| | | | | |
|---|---|---|---|---|
| 6,522,521 | B2 * | 2/2003 | Mizuno et al. | 361/321.4 |
| 8,570,710 | B2 * | 10/2013 | Kim et al. | 361/321.2 |
| 2005/0088803 | A1 | 4/2005 | Umeda et al. | |
| 2008/0212257 | A1 * | 9/2008 | Sakamoto et al. | 361/305 |
| 2011/0157766 | A1 | 6/2011 | Cho et al. | |
| 2012/0300361 | A1 * | 11/2012 | Togashi | 361/301.4 |
| 2014/0182907 | A1 * | 7/2014 | Lee et al. | 174/258 |

FOREIGN PATENT DOCUMENTS

| | | |
|---|---|---|
| JP | 5-74644 A | 3/1993 |
| JP | 2005-129802 A | 5/2005 |
| JP | 2011-135033 A | 7/2011 |

OTHER PUBLICATIONS

Korean Office action issued in Korean Application No. 10-2013-0042860 dated Jun. 12, 2014, w/English translation.

* cited by examiner

*Primary Examiner* — Hoa C Nguyen
(74) *Attorney, Agent, or Firm* — McDermott Will & Emery LLP

(57) ABSTRACT

A multilayer ceramic electronic component includes a ceramic body including dielectric layers stacked in a thickness direction and satisfying $T/W > 1.0$ when a width thereof is W and a thickness thereof is T; first and second internal electrodes; and first and second external electrodes, wherein when the ceramic body is divided into five regions in a width direction and a central region among the five regions is CW1 and regions adjacent to the central region CW1 are CW2 and CW3, a difference between electrode connectivity of the central region CW1 and electrode connectivity of the region CW2 or CW3 satisfies $0.02 \leq (CW2 \text{ or } CW3) - CW1 \leq 0.10$.

13 Claims, 7 Drawing Sheets

MULTILAYER CERAMIC ELECTRONIC COMPONENT, MANUFACTURING METHOD THEREOF, AND BOARD FOR MOUNTING THE SAME

CROSS-REFERENCE TO RELATED APPLICATIONS

This application claims the priority of Korean Patent Application No. 10-2013-0042860 filed on Apr. 18, 2013, in the Korean Intellectual Property Office, the disclosure of which is incorporated herein by reference.

BACKGROUND OF THE INVENTION

1. Field of the Invention

The present invention relates to a multilayer ceramic electronic component, a manufacturing method thereof, and a board for mounting the same.

2. Description of the Related Art

In accordance with the recent trend for the miniaturization of electronic products, a multilayer ceramic electronic component used in electronic products has been required to be reduced in size and to have a high degree of capacitance implemented therein.

Therefore, efforts to thin dielectric layers and internal electrodes to be stacked in greater amounts have been attempted using various methods, and recently, a multilayer ceramic electronic component in which a thickness of the dielectric layer is reduced and the number of stacked dielectric layers is increased has been manufactured.

Accordingly, the multilayer ceramic electronic component is able to be miniaturized, due to the dielectric layers and the internal electrodes being thinned, allowing the number of stacked layers to be increased for the implementation of a high degree of capacitance.

However, in the case in which the number of stacked layers is increased while the thickness of dielectric layers and internal electrodes is reduced as described above, a multilayer ceramic electronic component may achieve high capacitance, but a thickness of the resultant multilayer ceramic electronic component may be greater than a width thereof, due to an increase in the number of stacked layers.

In the case in which the thickness of the multilayer ceramic electronic component is greater than the width thereof as described above, since external electrodes formed on both end surfaces of the multilayer ceramic electronic component generally have a rounded circumferential surface, when the multilayer ceramic electronic component is mounted on a printed circuit board, or the like, the multilayer ceramic electronic component may not be maintained in a mounted state, but may topple over frequently, whereby a failure rate in mounting the multilayer ceramic electronic component has increased.

In addition, in the case of highly stacked multilayer ceramic electronic components manufactured according to the related art, a ceramic body thereof has a vertically convex shape. In this case, the ceramic body has a convex shape such that a central portion of the internal electrode, that is, the highest portion thereof has a height higher than both sides of the ceramic body, and thus, the problem in which the multilayer ceramic electronic component topples over when mounted on the printed circuit board, or the like, may be intensified.

The following related art document 1 discloses a multilayer ceramic condenser having small size and high capacitance, but does not describe a means for solving the problem in which a multilayer ceramic condenser topples over at the time of being mounted on a printed circuit board.

RELATED ART DOCUMENT (Patent Document 1) Japanese Patent Laid-Open Publication No. JP 2005-129802

SUMMARY OF THE INVENTION

An aspect of the present invention provides a multilayer ceramic electronic component capable of solving a problem in which a multilayer ceramic electronic component having a thickness greater than a width thereof topples over at the time of being mounted on a printed circuit board, or the like, while having high capacitance implemented therein.

According to an aspect of the present invention, there is provided a multilayer ceramic electronic component including: a ceramic body including a plurality of dielectric layers stacked in a thickness direction and satisfying $T/W>1.0$ when a width thereof is defined as W and a thickness thereof is defined as T; a plurality of first and second internal electrodes disposed in the ceramic body so as to face each other, having the dielectric layer interposed therebetween, and alternately exposed through both end surfaces of the ceramic body; and first and second external electrodes formed on both end surfaces of the ceramic body and electrically connected to the first and second internal electrodes, respectively, wherein when the ceramic body is divided into five regions in a width direction and a central region among the five regions is defined as CW1 and regions adjacent to the central region CW1 are defined as CW2 and CW3, a difference between electrode connectivity of the central region CW1 and electrode connectivity of the region CW2 or CW3 adjacent to the central region CW1 satisfies $0.02 \leq (CW2\ or\ CW3) - CW1 \leq 0.10$.

The ceramic body may satisfy $1.2 \leq T/W \leq 3.0$.

When the first and second internal electrodes are divided into three regions in the width direction and a central region among the three regions is defined as EW1 and regions adjacent to the central region EW1 are defined as EW2 and EW3, a ratio (EW2 or EW3)/EW1 of a thickness of the region EW2 or EW3 adjacent to the central region EW1 to a thickness of the central region EW1 may satisfy $1.10 \leq (EW2\ or\ EW3)/EW1 \leq 2.00$.

The central region CW1 of the ceramic body among the five regions may have electrode connectivity of 85% or more, and the regions CW2 and CW3 adjacent to the central region CW1 may have electrode connectivity of 80% or more.

The first and second internal electrodes may have an average thickness of 0.2 to 0.85 μm.

When a thickness of the ceramic body is defined as Hc and a distance from a bottom of the ceramic body to an uppermost internal electrode is defined as He, He<Hc may be satisfied.

According to another aspect of the present invention, there is provided a method of manufacturing a multilayer ceramic electronic component, the method including: preparing ceramic sheets; forming internal electrode patterns on the ceramic sheets by using a conductive paste containing a metal powder; stacking the ceramic sheets having the internal electrode patterns formed thereon so as to face each other, having the ceramic sheet interposed therebetween, and pressurizing the ceramic sheets to prepare a multilayer body satisfying $T/W>1.0$ when a width of the multilayer body is defined as W and a thickness thereof is defined as T; cutting the multilayer body along a line defining a size of a single capacitor and sintering the same to prepare a ceramic body such that first and second internal electrodes are alternately exposed through both end surfaces of the ceramic body; and forming first and second external electrodes on the ceramic body so as to be electrically connected to the first and second internal electrodes, respectively, wherein when the ceramic body is divided into five regions in a width direction and a central region among the five regions is defined as CW1 and regions adjacent to the central region CW1 are defined as CW2 and CW3, a difference between electrode connectivity of the central region CW1 and electrode connectivity of the region CW2 or CW3 adjacent to the central region CW1 satisfies 0.02≤(CW2 or CW3)−CW1≤0.10.

According to another aspect of the present invention, there is provided a board for mounting a multilayer ceramic electronic component, the board including: a printed circuit board having first and second electrode pads disposed thereon; and the multilayer ceramic electronic component as described above installed on the first and second electrode pads.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
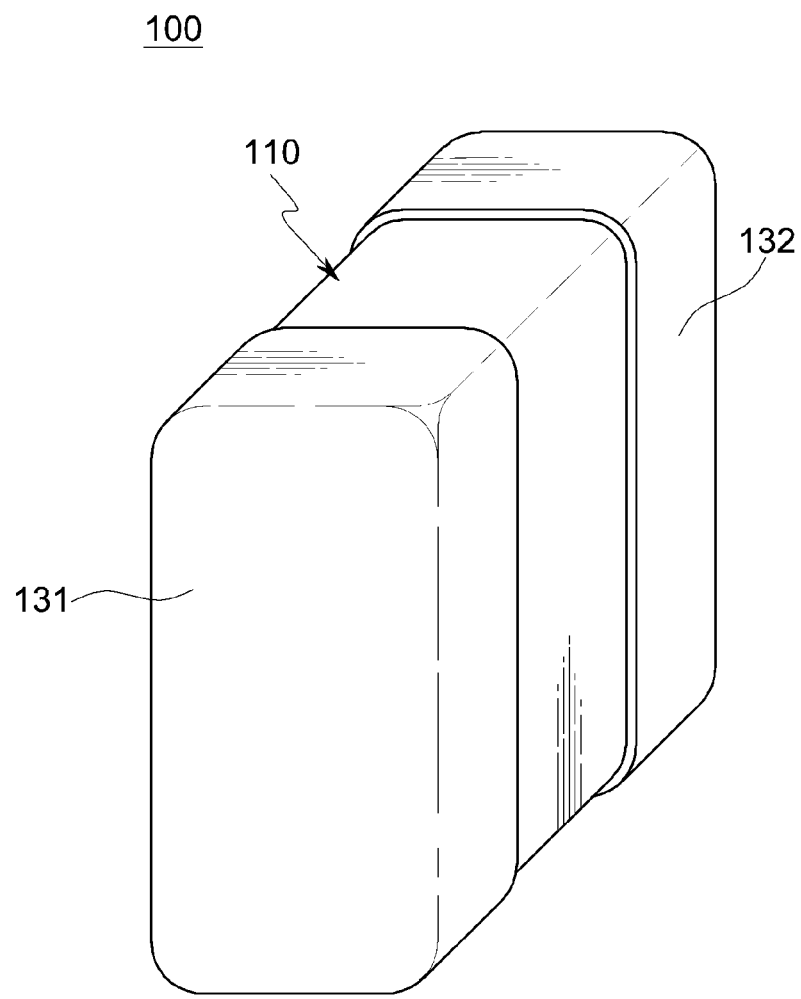
FIG. 1 is a perspective view schematically showing a multilayer ceramic capacitor according to an embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like elements.

Hereinafter, a multilayer ceramic electronic component according to an embodiment of the present invention will be described. In particular, a multilayer ceramic capacitor will be described. However, the invention is not limited thereto.

Multilayer Ceramic Capacitor

Figure 2:
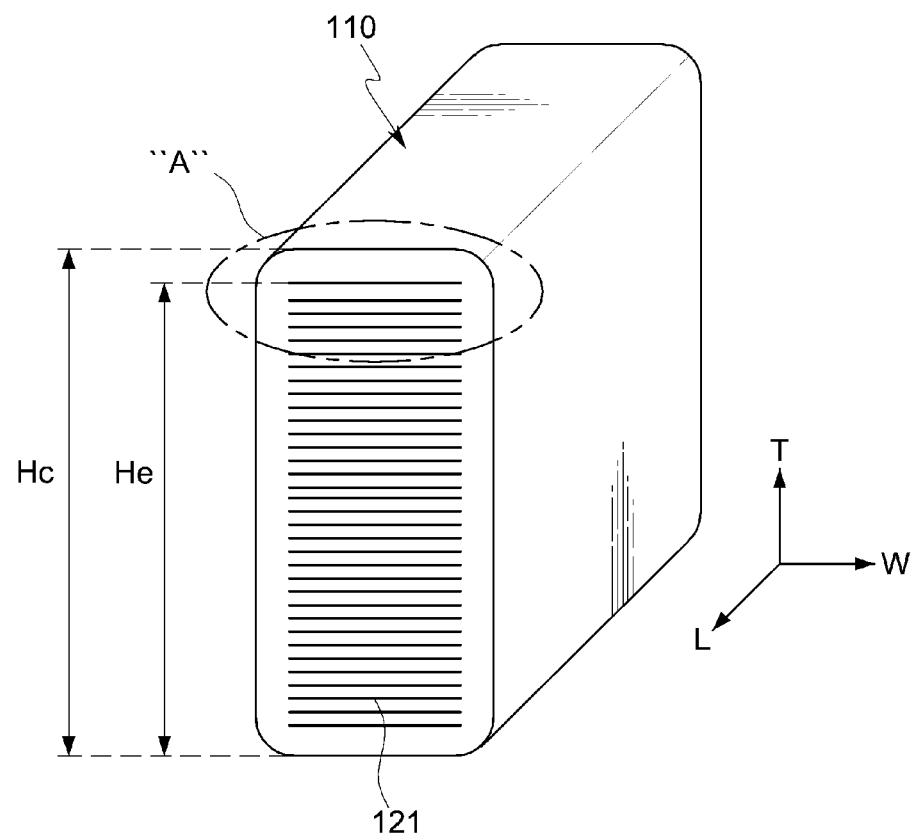
FIG. 2 is a perspective view showing a state in which external electrodes are separated from the multilayer ceramic capacitor of FIG. 1.

FIG. 1 is a perspective view schematically showing a multilayer ceramic capacitor according to an embodiment of the invention, and FIG. 2 is a perspective view showing a state in which external electrodes are separated from the multilayer ceramic capacitor of FIG. 1.

Referring to FIGS. 1 and 2, a multilayer ceramic capacitor 100 according to the embodiment of the invention may include a ceramic body 110, a plurality of first and second internal electrodes 121 and 122, and first and second external electrodes 131 and 132.

The ceramic body 110 may be manufactured by stacking a plurality of dielectric layers 111 in a thickness direction, and sintering the stacked dielectric layers. Here, adjacent dielectric layers 111 may be integrated such that boundaries therebetween may not be readily apparent without the use of a scanning electron microscope (SEM).

A shape of the ceramic body 110 is not specifically limited, and for example, the ceramic body 110 may have a hexahedral shape.

When defining respective directions of the hexahedron forming the ceramic body 110 in order to clearly describe the embodiment of the invention, L, W and T in FIG. 2 refer to a length direction, a width direction, and a thickness direction, respectively.

In addition, for convenience of explanation, uppermost and lowermost surfaces of the ceramic body 110 opposing each other in a thickness direction refer to first and second main surfaces, end surfaces connecting the first and second main surfaces to each other and opposing each other in a length direction refer to first and second end surfaces, and side surfaces opposing each other in a width direction refer to first and second side surfaces.

Further, the ceramic body 110 having a form in which the number of dielectric layers 111 is increased in order to implement a high degree of capacitance therein may satisfy T/W>1.0 when a width thereof is defined as W and a thickness thereof is defined as T, such that the ceramic body 110 has a thickness greater than a width thereof. Here, the ceramic body 110 may satisfy 1.2≤T/W≤3.0, T/W being a ratio of the thickness of the ceramic body to the width of the ceramic body.

In addition, when a thickness of the ceramic body 110 is defined as Hc and a distance from the bottom of the ceramic body 110 to the uppermost internal electrode 121 is defined as He, He<Hc may be satisfied, thereby preventing the multilayer ceramic capacitor 100 from toppling over at the time of being mounted on a printed circuit board, or the like to prevent failure in mounting the multilayer ceramic capacitor 100.

That is, the ceramic body 110 may have a shape in which a central portion of the uppermost internal electrode 121 in a width direction, that is, the highest portion thereof has a height lower than that of both sides of the ceramic body 110.

The dielectric layer 111 may include a ceramic material having a high degree of permittivity, for example, a $BaTiO_3$-based ceramic powder, or the like. However, the invention is not limited thereto as far as sufficient capacitance may be obtained.

Further, in addition to the ceramic powder, a transition metal oxide or carbide, a rare-earth element, various ceramic additives such as magnesium (Mg), aluminum (Al), and the like, an organic solvent, a plasticizer, a binder, a dispersant, or the like, may be added to the dielectric layer 111, if needed.

Figure 3:
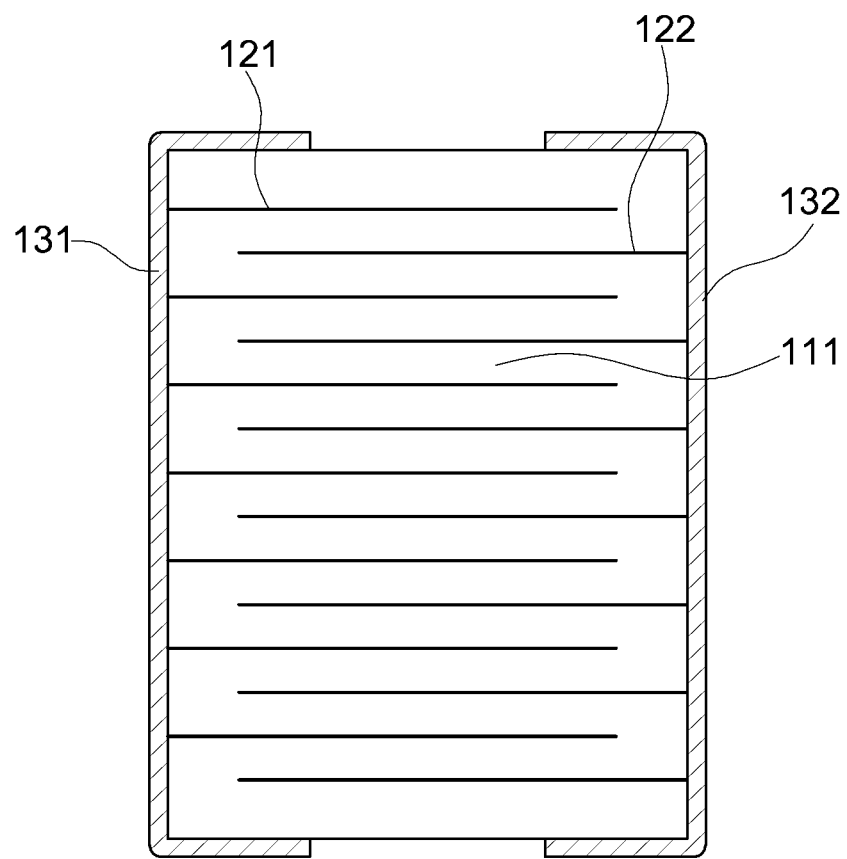
FIG. 3 is a side cross-sectional view of FIG. 1.

FIG. 3 is a cross-sectional view showing the multilayer ceramic capacitor according to the embodiment of the invention.

Referring to FIG. 3, the first and second internal electrodes 121 and 122, having different polarities, may be disposed to face each other, having the ceramic sheet forming the dielectric layer 111 interposed therebetween, and may be exposed through the first and second end surfaces of the ceramic body 110, respectively.

Here, the first and second internal electrodes 121 and 122 may be electrically insulated by the dielectric layer 111 disposed therebetween.

In addition, the first and second internal electrodes 121 and 122 may be formed of a conductive metal. For example, any one of silver (Ag), palladium (Pd), platinum (Pt), nickel (Ni), and copper (Cu) or alloys thereof, or the like, may be used as the conductive metal. However, the invention is not limited thereto.

The first and second external electrodes 131 and 132 may be extended from both end surfaces of the ceramic body 110 to the first and second main surfaces thereof, and may be electrically connected to the plurality of first and second internal electrodes 121 and 122, by covering portions of the plurality of first and second internal electrodes 121 and 122 exposed through the end surfaces of the ceramic body 110, respectively.

In addition, the first and second external electrodes 131 and 132 may be formed of a conductive metal, for example, silver (Ag), nickel (Ni), copper (Cu), or the like. The first and second external electrodes 131 and 132 may be formed by applying a conductive paste to both end surfaces of the ceramic body 110, the conductive paste being prepared by adding a glass frit to the conductive metal powder, and performing a sintering process thereon, but the invention is not limited thereto.

Meanwhile, if needed, first and second plating layers (not shown) may be formed on the first and second external electrodes 131 and 132.

When the multilayer ceramic capacitor 100 is mounted on the printed circuit board by a solder, the first and second plating layers may increase adhesive strength therebetween.

For example, the first and second plating layers may include a nickel (Ni) plating layer formed on the first and second external electrodes 131 and 132, and a tin (Sn) plating layer formed on the nickel plating layer, but the invention is not limited thereto.

Figure 4:
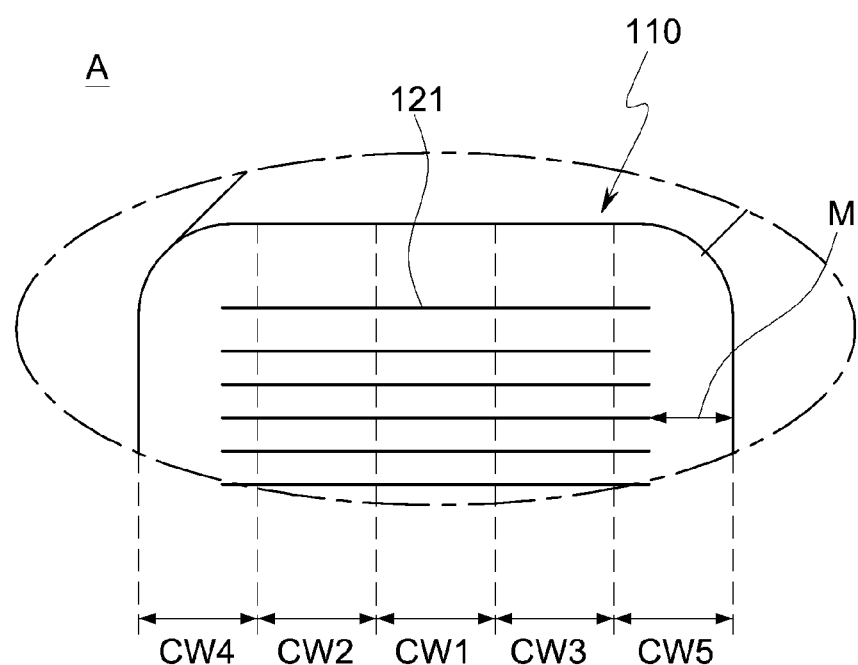
FIG. 4 is an enlarged perspective view of part A of FIG. 2.

FIG. 4 is an enlarged perspective view of part A of FIG. 2.

Referring to FIG. 4, in the case in which the ceramic body 110 is divided into five regions CW1 to CW5 in a width direction, when a central region among the five regions is defined as CW1 and regions adjacent to the central region CW1 are defined as CW2 and CW3, a difference (CW2 or CW3)−CW1 between electrode connectivity of the central region CW1 and electrode connectivity of the region CW2 or CW3 adjacent to the central region CW1 may satisfy $0.02 \leq (CW2 \text{ or } CW3) - CW1 \leq 0.10$.

Here, the central region CW1, among the five regions, may have electrode connectivity of 85% or more, and the regions CW2 and CW3 adjacent to the central region CW1 may have electrode connectivity of 80% or more.

In the case in which a value of (CW2 or CW3)−CW1 is less than 0.02, an effect in which the shape of the multilayer ceramic capacitor 100 is improved is not sufficient, such that the multilayer ceramic capacitor 100 may topple over. In addition, in the case in which the value of (CW2 or CW3)−CW1 is more than 0.10, it may be difficult to secure the electrode connectivity of the central region CW1, and to implement high capacitance therein.

Further, in the case in which the electrode connectivity of the central region CW1 is less than 85%, or the electrode connectivity of the regions CW2 and CW3 adjacent to the central region CW1 is less than 80%, electrode connectivity may be deteriorated, and therefore, capacitance may be decreased.

Figure 5A:
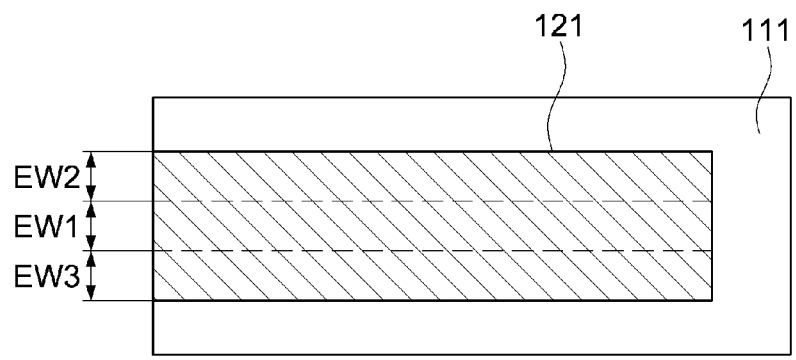
FIGS. 5A and 5B are plan views showing structures of first and second internal electrodes of the multilayer ceramic capacitor according to the embodiment of the present invention.
Figure 5B:
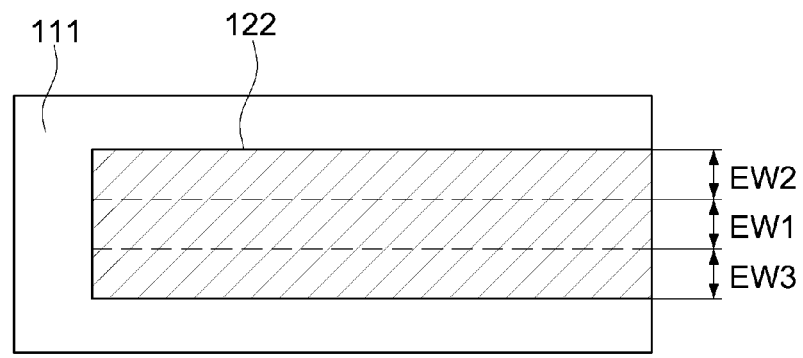

FIGS. 5A and 5B are plan views showing the structure of first and second internal electrodes of the multilayer ceramic capacitor according to the embodiment of the invention.

Referring to FIGS. 5A and 5B, in the case in which the first and second internal electrodes 121 and 122 are divided into three regions EW1 to EW3 in a width direction, when a central region, among the three regions, is defined as EW1 and regions adjacent to the central region EW1 are defined as EW2 and EW3, a ratio (EW2 or EW3)/EW1 of a thickness of the region EW2 or EW3 adjacent to the central region EW1 to a thickness of the central region EW1 may satisfy $1.10 \leq (EW2 \text{ or } EW3)/EW1 \leq 2.00$.

Here, an average thickness of the first and second internal electrodes 121 and 122 may be measured by capturing an image of a cross-section of the ceramic body 110 in a length direction using a scanning electron microscope (SEM).

For example, the average thickness may be calculated by measuring thicknesses at thirty equidistant points in a length direction of anyone of the internal electrodes extracted from the image obtained by scanning the cross section of the ceramic body 110 in the length and thickness direction L-T taken in the central portion of the ceramic body 110 in the width direction using the scanning electron microscope (SEM).

The thicknesses at thirty equidistant points may be measured in an active region, a region in which the first and second internal electrodes 121 and 122 are overlapped with each other.

In addition, in the embodiment of the invention, the average thickness of the first and second internal electrodes 121 and 122 may be 0.2 to 0.85 µm.

When the average thickness of the first and second internal electrodes 121 and 122 is less than 0.2 µm, electrode connectivity may be deteriorated, and thus, it may be difficult to implement high capacitance.

In addition, when the average thickness of the first and second internal electrodes 121 and 122 is more than 0.85 µm, the multilayer ceramic capacitor may have a limitation in the number of stacked layers due to a limitation in a size thereof in the thickness direction by an increase in the thickness of the internal electrode to thereby decrease capacitance, and delamination may occur at a margin part of the ceramic body 110 according to a ratio between the dielectric layer 111 and the internal electrode.

In the case in which the thickness of the internal electrode in respective positions is adjusted, the shrinkage of the central portion of the ceramic body 110 is induced to significantly decrease the phenomenon in which the first and second main surfaces of the ceramic body 110 have a convex shape, whereby the problems that the multilayer ceramic capacitor topples over at the time of being mounted on the printed circuit board, or the like, may be prevented to significantly decrease a failure rate in mounting the multilayer ceramic capacitor.

The following Table 1 shows whether or not target capacitance is implemented in the multilayer ceramic capacitor and whether or not the multilayer ceramic capacitor topples over at the time of being mounted on the printed circuit board, with respect to electrode connectivity measured in respective regions of the internal electrode of the ceramic body 110.

TABLE 1

| Sample No. | Average Printed Thickness of (EW2) or (EW3)/ Average Printed Thickness of (EW1) | Average Electrode Connectivity of (CW2) or (CW3) - Average Electrode Connectivity of (CW1) | Hc vs He | Implementation of Target Capacitance | Incidence of Multilayer Ceramic Capacitor Toppling over at the time of Being Mounted on Board |
|---|---|---|---|---|---|
| 1 | 90% | −2% | Hc < He | ○ | x |
| 2 | 95% | −1% | Hc < He | ○ | x |
| 3 | 100% | 0% | Hc < He | ○ | x |
| 4 | 105% | 1% | Hc < He | ○ | x |
| 5 | 110% | 2% | Hc > He | ○ | ○ |
| 6 | 115% | 3% | Hc > He | ○ | ○ |
| 7 | 120% | 3% | Hc > He | ○ | ○ |
| 8 | 140% | 4% | Hc > He | ○ | ○ |
| 9 | 160% | 6% | Hc > He | ○ | ○ |
| 10 | 180% | 8% | Hc > He | ○ | ○ |
| 11 | 200% | 10% | Hc > He | ○ | ○ |
| 12 | 220% | 11% | Hc > He | x | ○ |
| 13 | 250% | 12% | Hc > He | x | ○ |
| 14 | 300% | 15% | Hc > He | x | ○ |

Referring to table 1, it may be appreciated that in the case of samples 1 to 4 in which the value of (CW2 or CW3)−CW1 was less than 0.02 and the value of (EW2 or EW3)/EW1 was less than 1.10, and a mounting surface of the ceramic body, that is, the second main surface, had a downwardly convex shape, and when each sample was mounted on a printed circuit board, or the like, twenty times, it toppled over several times. That is, the fault rate in mounting the multilayer ceramic capacitor was significantly increased.

In addition, it may be appreciated that in the case of samples 5 to 11 in which the value of (CW2 or CW3)−CW1 was 0.02 to 0.10 and the value of (EW2 or EW3)/EW1 was 1.10 to 2.00, and a mounting surface of the ceramic body, that is, the second main surface, did not have a convex shape, and when each sample was mounted on the printed circuit board, or the like, twenty times, it did not topple over. That is, safety in mounting the multilayer ceramic capacitor was present.

Further, it may be appreciated that in the case of sample 12 in which the value of (CW2 or CW3)−CW1 was more than 0.10 and the value of (EW2 or EW3)/EW1 was less than 1.10, and a mounting surface of the ceramic body, that is, the second main surface did not have a convex shape, and when the multilayer ceramic capacitor was mounted on the printed circuit board, or the like, twenty times, it did not topple over. That is, safety in mounting the multilayer ceramic capacitor was present. However, in the case of sample 12, since the thickness of the internal electrode positioned in the central portion of the ceramic body was extremely thin, the overlap area between the internal electrodes was reduced to decrease the capacitance of a product, whereby it may be difficult to implement a high capacitance multilayer ceramic capacitor.

Modified Example

Figure 6:
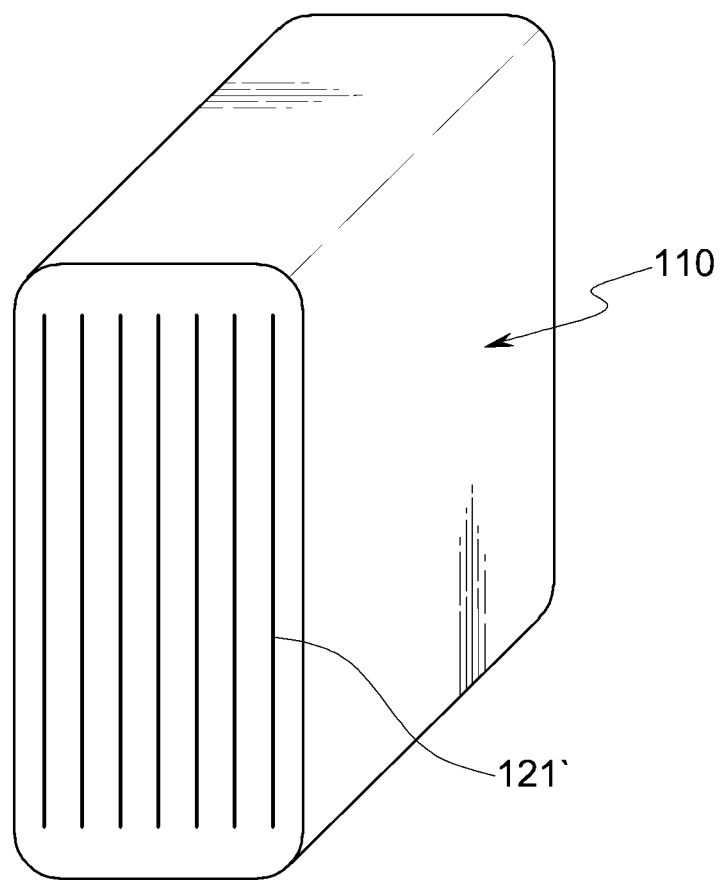
FIG. 6 is a perspective view showing a state in which external electrodes are separated from a multilayer ceramic capacitor according to another embodiment of the present invention.

FIG. 6 is a perspective view showing a state in which external electrodes are separated from a multilayer ceramic capacitor according to another embodiment of the invention.

Here, since a structure in which the first and second external electrodes 131 and 132 are formed is the same as that of the previously described embodiment of the invention, a detailed description thereof will be omitted in order to avoid overlapped descriptions, and a first internal electrode 121' and a second internal electrode (not shown) having a different structure from the previously described embodiment of the invention will be described in detail.

Referring to FIG. 6, a multilayer ceramic capacitor according to another embodiment of the invention may include a ceramic body 110 having a plurality of dielectric layers stacked in a width direction of the ceramic body 110.

Therefore, the first internal electrode 121' and the second internal electrode may be disposed in the width direction so as to face each other, having the ceramic sheet forming the dielectric layer interposed therebetween, and may be exposed through first and second end surfaces of the ceramic body 110, respectively. Here, the first internal electrode 121' and the second internal electrode may be electrically insulated from each other by the dielectric layer disposed therebetween.

Method of Manufacturing Multilayer Ceramic Capacitor

Hereinafter, a method of manufacturing a multilayer ceramic capacitor according to an embodiment of the invention will be described.

First, a plurality of ceramic sheets are prepared. The ceramic green sheets, used to form the dielectric layers 111 of the ceramic body 110, are produced by mixing a ceramic powder, a polymer, a solvent, and the like, to prepare a ceramic slurry, and then applying the ceramic slurry to a carrier film using a doctor blade method or the like, and drying the ceramic slurry thereon, to be manufactured as a sheet having a thickness of several μm.

Then, the conductive paste is printed on at least one surface of the ceramic sheet to a thickness of 0.2 to 0.85 μm to thereby form a plurality of internal electrode patterns having a predetermined interval therebetween in a length direction.

In the case in which the ceramic sheet is divided into five regions in a width direction, when a central region among the five regions is defined as CW1 and regions adjacent to the central region CW1 are defined as CW2 and CW3, a difference (CW2 or CW3)−CW1 between electrode connectivity of the central region CW1 and electrode connectivity of the region CW2 or CW3 adjacent to the central region CW1 satisfies $0.02 \leq (CW2 \text{ or } CW3) - CW1 \leq 0.10$.

Here, the central region CW1 has electrode connectivity of 85% or more, and the regions CW2 and CW3 adjacent to the central region CW1 have electrode connectivity of 80% or more.

In addition, in the case in which the internal electrode patterns are divided into three regions in a width direction, when a central region among the three regions is defined as EW1 and regions adjacent to the central region EW1 are defined as EW2 and EW3, a ratio (EW2 or EW3)/EW1 of a thickness of the region EW2 or EW3 adjacent to EW1 to a thickness of the central region EW1 satisfies 1.10≤(EW2 or EW3)/EW1≤2.00.

A method of printing the conductive paste for forming the internal electrode pattern may include a screen printing method, a gravure printing method, and the like, but the invention is not limited thereto.

Then, a multilayer body is prepared by alternately stacking the plurality of ceramic sheets having the internal electrode patterns formed thereon in a thickness direction, and pressurizing them in a stacking direction.

Next, after the multilayer body is cut to 0603-standard size (length×width) chips, each corresponding to a size of a single capacitor, in which a thickness/length of the chip is more than 1.0. The chip is sintered at a high temperature and polished to thereby realize the ceramic body 110 having the first and second internal electrodes 121 and 122. Here, the ceramic body 110 may be manufactured so that T/W satisfies 1.2≤T/W≤3.0.

In addition, when a thickness of the ceramic body 110 is defined as Hc and a distance from the bottom of the ceramic body 110 to the uppermost internal electrode 121 is defined as He, the ceramic body 110 may satisfy He<Hc.

Then, first and second external electrodes 131 and 132 are formed on both end surfaces of the ceramic body 110 in a length direction thereof so as to be electrically connected to the exposed portions of the first and second internal electrodes 121 and 122.

Here, if needed, after forming of the first and second external electrodes 131 and 132, a plating process such as an electroplating process may be performed on surfaces of the first and second external electrodes 131 and 132 to form first and second plating layers (not shown).

Board for Mounting Multilayer Ceramic Capacitor

Figure 7:
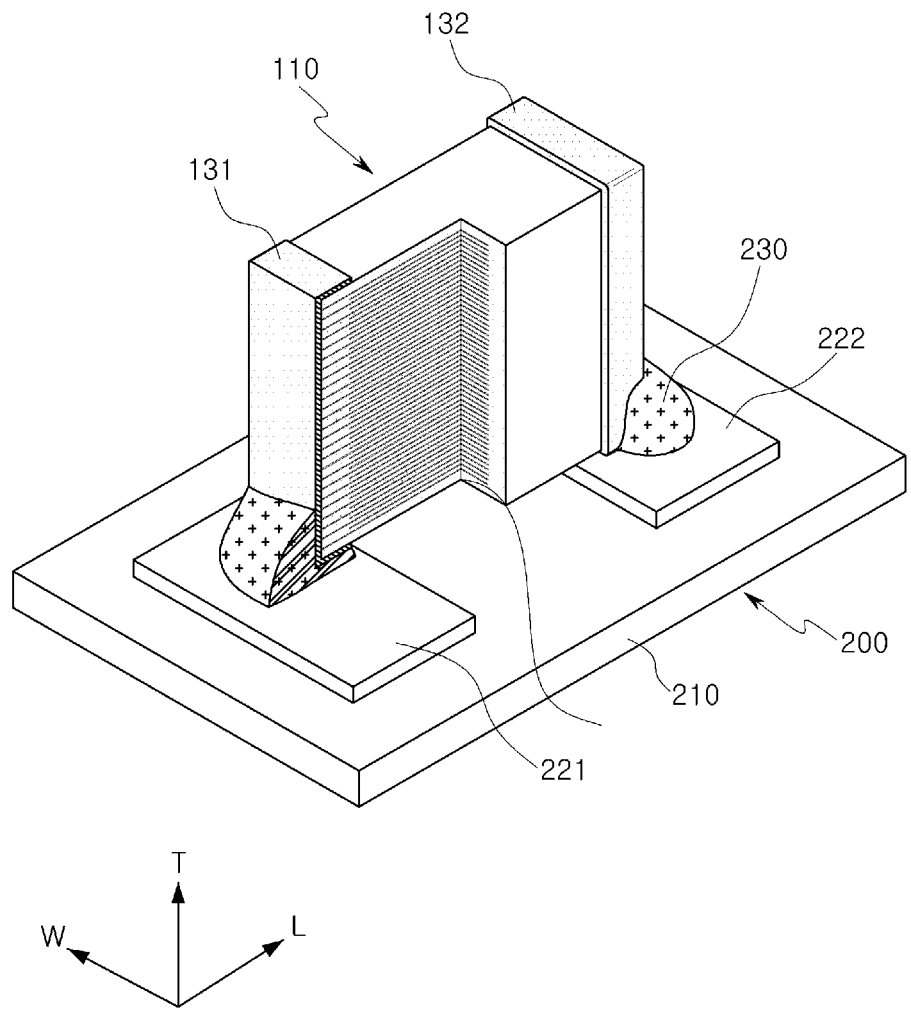
FIG. 7 is a partially cut-away perspective view schematically showing a multilayer ceramic capacitor mounted on a printed circuit board according to an embodiment of the present invention.

FIG. 7 is a partially cut-away perspective view schematically showing a multilayer ceramic capacitor mounted on a printed circuit board according to an embodiment of the invention.

Referring to FIG. 7, a board 200 for mounting the multilayer ceramic capacitor 100 according to the embodiment of the invention may include a printed circuit board 210 having the multilayer ceramic capacitor 100 mounted thereon so as to be vertical or horizontal, and first and second electrode pads 221 and 222 formed on the printed circuit board 210 so as to be spaced apart from each other.

Here, the multilayer ceramic capacitor 100 may be electrically connected to the printed circuit board 210 by a solder 230 in a state in which the second main surface of the ceramic body 110 is disposed at the lowermost in the thickness direction as a mounting surface, and portions of the first and second external electrodes 131 and 132 disposed on the second main surface are positioned to contact the first and second electrode pads 221 and 222, respectively.

As set forth above, according to embodiments of the invention, the thickness of the internal electrode is adjusted in regions of the ceramic body having the thickness larger than the width such that the difference in electrode connectivity may be caused, and the shrinkage of the central portion of the internal electrode is induced to thereby alleviate the phenomenon in which the circumference surface of the external electrode is rounded, whereby problems in which the ceramic body topples over at the time of being mounted on the printed circuit board, or the like, may be prevented to decrease a failure rate in mounting the multilayer ceramic electronic component.

While the present invention has been shown and described in connection with the embodiments, it will be apparent to those skilled in the art that modifications and variations can be made without departing from the spirit and scope of the invention as defined by the appended claims.

What is claimed is:
1. A multilayer ceramic electronic component comprising:
   a ceramic body including a plurality of dielectric layers stacked in a thickness direction and satisfying T/W>1.0 when a width thereof is defined as W and a thickness thereof is defined as T;
   a plurality of first and second internal electrodes disposed in the ceramic body so as to face each other, having the dielectric layer interposed therebetween, and alternately exposed through both end surfaces of the ceramic body; and
   first and second external electrodes formed on both end surfaces of the ceramic body and electrically connected to the first and second internal electrodes, respectively,
   wherein when the ceramic body is divided into five regions in a width direction and a central region among the five regions is defined as CW1 and regions adjacent to the central region CW1 are defined as CW2 and CW3, a difference between electrode connectivity of the central region CW1 and electrode connectivity of the region CW2 or CW3 adjacent to the central region CW1 satisfies 0.02≤(CW2 or CW3)−CW1≤0.10.

2. The multilayer ceramic electronic component of claim 1, wherein the ceramic body satisfies 1.2≤T/W≤3.0.

3. The multilayer ceramic electronic component of claim 1, wherein when the first and second internal electrodes are divided into three regions in the width direction and a central region among the three regions is defined as EW1 and regions adjacent to the central region EW1 are defined as EW2 and EW3, a ratio (EW2 or EW3)/EW1 of a thickness of the region EW2 or EW3 adjacent to the central region EW1 to a thickness of the central region EW1 satisfies 1.10≤(EW2 or EW3)/EW1≤2.00.

4. The multilayer ceramic electronic component of claim 1, wherein the central region CW1 of the ceramic body among the five regions has electrode connectivity of 85% or more, and the regions CW2 and CW3 adjacent to the central region CW1 have electrode connectivity of 80% or more.

5. The multilayer ceramic electronic component of claim 1, wherein the first and second internal electrodes have an average thickness of 0.2 to 0.85 μm.

6. The multilayer ceramic electronic component of claim 1, wherein when a thickness of the ceramic body is defined as Hc and a distance from a bottom of the ceramic body to an uppermost internal electrode is defined as He, He<Hc is satisfied.

7. A board for mounting a multilayer ceramic electronic component, the board comprising:
   a printed circuit board having first and second electrode pads disposed thereon; and
   the multilayer ceramic electronic component of any one of claims 1 to 6 installed on the first and second electrode pads.

8. A method of manufacturing a multilayer ceramic electronic component, the method comprising:
   preparing ceramic sheets;
   forming internal electrode patterns on the ceramic sheets by using a conductive paste containing a metal powder;

stacking the ceramic sheets having the internal electrode patterns formed thereon so as to face each other, having the ceramic sheet interposed therebetween, and pressurizing the ceramic sheets to prepare a multilayer body satisfying T/W>1.0 when a width of the multilayer body is defined as W and a thickness thereof is defined as T;

cutting the multilayer body along a line defining a size of a single capacitor and sintering the same to prepare a ceramic body such that first and second internal electrodes are alternately exposed through both end surfaces of the ceramic body; and forming first and second external electrodes on the ceramic body so as to be electrically connected to the first and second internal electrodes, respectively, wherein when the ceramic body is divided into five regions in a width direction and a central region among the five regions is defined as CW1 and regions adjacent to the central region CW1 are defined as CW2 and CW3, a difference between electrode connectivity of the central region CW1 and electrode connectivity of the region CW2 or CW3 adjacent to the central region CW1 satisfies 0.02≤(CW2 or CW3)−CW1≤0.10.

9. The method of claim 8, wherein the ceramic body satisfies 1.2≤T/W≤3.0.

10. The method of claim 8, wherein when the first and second internal electrodes are divided into three regions in the width direction and a central region among the three regions is defined as EW1 and regions adjacent to the central region EW1 are defined as EW2 and EW3, a ratio (EW2 or EW3)/EW1 of a thickness of the region EW2 or EW3 adjacent to the central region EW1 to a thickness of the central region EW1 satisfies 1.10≤(EW2 or EW3)/EW1≤2.00.

11. The method of claim 8, wherein the central region CW1 of the ceramic body among the five regions has electrode connectivity of 85% or more, and the regions CW2 and CW3 adjacent to the central region CW1 have electrode connectivity of 80% or more.

12. The method of claim 8, wherein the first and second internal electrodes have an average thickness of 0.2 to 0.85 µm.

13. The method of claim 8, wherein when a thickness of the ceramic body is defined as Hc and a distance from a bottom of the ceramic body to an uppermost internal electrode is defined as He, He<Hc is satisfied.

* * * * *